United States Patent
Lee et al.

(10) Patent No.: US 10,403,581 B2
(45) Date of Patent: Sep. 3, 2019

(54) ELECTRONIC DEVICE PACKAGES WITH ATTENUATED ELECTROMAGNETIC INTERFERENCE SIGNALS

(71) Applicant: Intel Corporation, Santa Clara, CA (US)

(72) Inventors: Jaejin Lee, Hillsboro, OR (US); Hao-Han Hsu, Portland, OR (US); Chung-Hao J. Chen, Portland, OR (US); Dong-Ho Han, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/721,729

(22) Filed: Sep. 29, 2017

(65) Prior Publication Data

US 2019/0103366 A1   Apr. 4, 2019

(51) Int. Cl.
*H01L 23/552* (2006.01)
*H01L 21/48* (2006.01)
*H01L 23/498* (2006.01)
*H01L 21/56* (2006.01)
*H01L 23/14* (2006.01)
*H01L 23/31* (2006.01)
*H01L 21/02* (2006.01)
*H05K 1/02* (2006.01)
*H01L 23/66* (2006.01)
(Continued)

(52) U.S. Cl.
CPC ...... *H01L 23/552* (2013.01); *H01L 21/02227* (2013.01); *H01L 21/4857* (2013.01); *H01L 21/563* (2013.01); *H01L 23/142* (2013.01); *H01L 23/16* (2013.01); *H01L 23/3114* (2013.01); *H01L 23/49838* (2013.01); *H01L 23/562* (2013.01); *H01L 23/66* (2013.01); *H05K 1/0271* (2013.01); *H01L 2223/6677* (2013.01); *H01L 2924/10253* (2013.01); *H01L 2924/14* (2013.01); *H01L 2924/153* (2013.01); *H01L 2924/15311* (2013.01); *H01L 2924/3025* (2013.01); *H01L 2924/3511* (2013.01)

(58) Field of Classification Search
CPC .............................. H01L 23/562; H01L 23/66
USPC ................................................... 257/659, 704
See application file for complete search history.

(56) References Cited

U.S. PATENT DOCUMENTS

| 5,866,943 A  | * | 2/1999 | Mertol ................... H01L 23/36 257/659 |
| 2004/0150118 A1 | * | 8/2004 | Honda ................... H01L 21/563 257/778 |

(Continued)

FOREIGN PATENT DOCUMENTS

WO    WO 2017/070843    5/2017

OTHER PUBLICATIONS

ARC Technologies Inc.; "Wave-X B0301 Series"; Technical Data Sheet; (Sep. 2014); 1 page; Revision A.
(Continued)

*Primary Examiner* — David Vu
*Assistant Examiner* — Brandon C Fox
(74) *Attorney, Agent, or Firm* — Thorpe North & Western, LLP; David W. Osborne

(57) ABSTRACT

Electronic device packages utilizing a stiffener coupled to a substrate with a magnetic lossy bonding layer to attenuate or absorb electromagnetic signals such as radio frequency interference (RFI) along with related systems and method are disclosed.

24 Claims, 9 Drawing Sheets

(51) Int. Cl.
*H01L 23/00* (2006.01)
*H01L 23/16* (2006.01)

(56) References Cited

U.S. PATENT DOCUMENTS

| | | | |
|---|---|---|---|
| 2009/0236731 A1* | 9/2009 | Shim | H01L 25/105 257/704 |
| 2013/0256819 A1 | 10/2013 | Watanabe et al. | |
| 2015/0371884 A1* | 12/2015 | Dauksher | H01L 24/81 438/7 |
| 2016/0268213 A1 | 9/2016 | Jiang et al. | |
| 2018/0103564 A1* | 4/2018 | Saito | H05K 9/0083 |

OTHER PUBLICATIONS

European Patent Application 18191353.4 filed Aug. 28, 2018; Jaejin Lee et al.; European Search Report dated Nov. 29, 2018.

* cited by examiner

600

610
A substrate defining a plane is provided.

620
An active layer is attached to the substrate comprising an electronic component that generates electromagnetic signals.

630
A stiffener layer is mechanically bonded to the substrate using a bonding layer to provide strength to the electronic device package, the bonding layer comprised of resin combined with magnetic particles, wherein the magnetic particles are configured to attenuate and absorb a portion of the electromagnetic signals.

FIG. 6

ELECTRONIC DEVICE PACKAGES WITH ATTENUATED ELECTROMAGNETIC INTERFERENCE SIGNALS

BACKGROUND

The demand for continually smaller electronic devices pressurizes the need for smaller and lighter electronic components. In an attempt to reduce cost, size and weight, electronic device packages are manufactured using smaller and lighter materials. Consequently, the package becomes increasingly susceptible to mechanical warpage from thermal forces during operation. To mitigate warpage, a stiffener may be added to the electronic device package. While stiffeners can be made of various materials, metal is most often the material of choice given its specific strength (i.e. strength to weight ratio). However, stiffeners having a metal body can act as an antenna and increase electromagnetic or radio frequency interference (EMI/RFI) risks and signal integrity risks. Metal body stiffeners can also make a central processing unit (CPU) more susceptible to electrostatic discharge noise and induce strong signal crosstalk at a stiffener resonant frequency. The RFI may originate from the package or may originate from other devices and may interfere with the normal operations of the electronic device package.

BRIEF DESCRIPTION OF THE DRAWINGS

Technology features and advantages will be apparent from the detailed description which follows, taken in conjunction with the accompanying drawings, which together illustrate, by way of example, features of the technology; and, wherein:

FIG. 6 is a flow diagram of a method for manufacturing an electronic device package in accordance with an example embodiment.

DESCRIPTION OF EMBODIMENTS

Figure 1A:
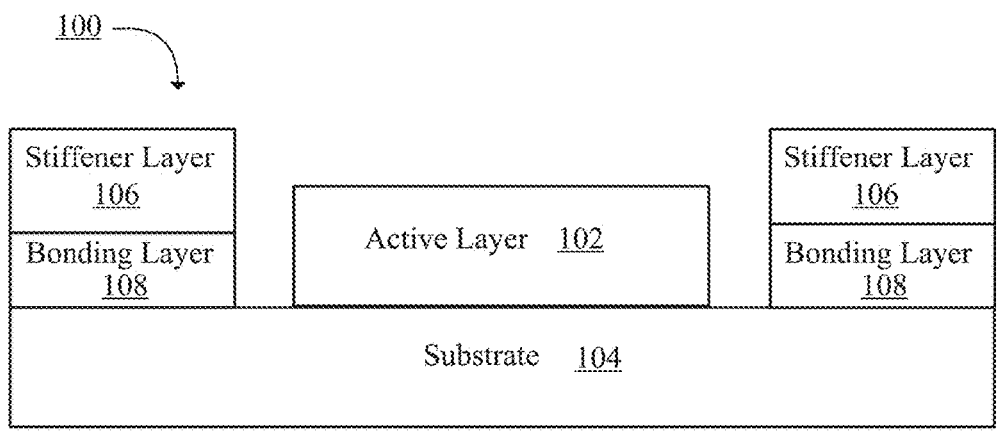
FIG. 1A is a block diagram of a cross section view of an electronic device package in accordance with an example embodiment.

Before technology embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to convey a thorough understanding of various invention embodiments. One skilled in the relevant art will recognize, however, that such detailed embodiments do not limit the overall inventive concepts articulated herein, but are merely representative thereof.

As used in this written description, the singular forms "a," "an" and "the" include express support for plural referents unless the context clearly dictates otherwise. Thus, for example, reference to "an integrated circuit" includes a plurality of such integrated circuits.

Reference throughout this specification to "an example" means that a particular feature, structure, or characteristic described in connection with the example is included in at least one technology embodiment. Thus, appearances of the phrases "in an example" or "in an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various technology embodiments and examples can be referred to herein along with alternatives for the various components thereof. It is understood that such embodiments, examples, and alternatives are not to be construed as de facto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of technology embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

The terms "first," "second," "third," "fourth," and the like in the written description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" objects or elements are in physical contact with one another. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, comparative terms such as "increased," "decreased," "better," "worse," "higher," "lower," "enhanced," "minimized," "reduce," and the like refer to a property of a device, component, or activity that is measurably different from other devices, components, or activities in a surrounding or adjacent area, in a single device or in multiple comparable devices, in a group or class, in multiple groups or classes, compared to the known state of the art, or as compared to a device, system, process, etc., which lacks a stated comparable structure, item, or feature. For example, a data region that has an "increased" risk of corruption can refer to a region of a memory device, which is more likely to have write errors to it than other regions in the same memory device. A number of factors can cause such increased risk, including location, fabrication process, number of program pulses applied to the region, etc. Furthermore, a memory device with a "minimized" risk of corruption due to a specifically stated feature can refer to a memory device with such feature as compared to a memory device without such feature.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases, depend on the specific context. However, generally speaking, the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood, that such a range format is used merely for convenience and brevity, and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

As used herein, a "bonding layer" refers to a layer of material that is capable of holding two opposing surfaces together. For example, opposing surfaces of a substrate and a stiffener placed adjacent to the substrate may be held together with such a bonding layer, thus achieving the effect of holding the substrate and stiffener together in an immobilized relationship. A variety of bonding materials such as adhesives, resins, epoxies, etc. can be used in a bonding layer. Additional materials can be included in the bonding layer/material in order to achieve a specific effect. In one example, magnetic particles may be included.

As used herein, an "active layer" can refer to a layer or combination of layers in an electronics device package, that produce EMI or RFI signals during operation. In some embodiments, one or more dies, components, or modules may be, or may be included in, an active layer.

As used herein, the terms "package substrate" and "substrate" can be used interchangeably and refer to a structure of an electronic device package on which an active layer is mounted or disposed. Though not necessary, in most embodiments, the substrate will be electrically coupled to the active layer and may provide an electrical path to a larger structure on which the electronic device package is mounted, such as a motherboard. In some embodiments, substrates can include multiple layers, such as a ground layer, dielectric layer(s), signal layer(s), solder mask layer(s), conductive layers or traces, etc. In some configurations, a substrate may include one or more layers that produce and EMI/RFI signal.

As used herein, "interference" refers to a disturbance that affects optimal function of an electrical circuit, device, or system by mechanisms such as electromagnetic induction, electrostatic coupling, conduction, etc. The disturbance may degrade the performance of the circuit, device, or system, or arrest its function. In the case of a data path, these effects can range from an increase in error rate to a total loss of the data. Interference types can include electromagnetic interference (EMI) or radio frequency interference (RFI) and such terms can be generally used interchangeably herein. Additionally, as used herein an "interference signal" or "signal interference" can be used interchangeably and refer to any signal (e.g. an electromagnetic or radio signal) that can cause interference. In one example, electromagnetic radiation (EMR) can produce a signal that causes EMI/RFI. Signals of these types can be referred to as "EMI signals" or "RFI signals," or simply as electromagnetic signals or radio frequency signals (EM signals or RF signals), and again such terms can be generally used interchangeably.

As used herein, the term "circuitry" can refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some aspects, the circuitry can be implemented in, or functions associated with the circuitry can be implemented by, one or more software or firmware modules. In some aspects, circuitry can include logic, at least partially operable in hardware.

Various techniques, or certain aspects or portions thereof, may take the form of program code (i.e., instructions) embodied in tangible media, such as floppy diskettes, compact disc-read-only memory (CD-ROMs), hard drives, transitory or non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a random-access memory (RAM), erasable programmable read only memory (EPROM), flash drive, optical drive, magnetic hard drive, solid state drive, or other medium for storing electronic data. The node and wireless device may also include a transceiver module (i.e., transceiver), a counter module (i.e., counter), a processing module (i.e., processor), and/or a clock module (i.e., clock) or timer module (i.e., timer). One or more programs that may implement or utilize the various techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

As used herein, the term "processor" can include general purpose processors, specialized processors such as VLSI, FPGAs, or other types of specialized processors, as well as base band processors used in transceivers to send, receive, and process wireless communications.

It should be understood that many of the functional units described in this specification may have been labeled as modules, in order to more particularly emphasize their implementation independence. For example, a module may be implemented as a hardware circuit comprising custom very-large-scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module may not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. The modules may be passive or active, including agents operable to perform desired functions.

Reference throughout this specification to "an example" or "exemplary" means that a particular feature, structure, or characteristic described in connection with the example is included in at least one embodiment of the present technology. Thus, appearances of the phrases "in an example" or the word "exemplary" in various places throughout this specification are not necessarily all referring to the same embodiment.

Example Embodiments

An initial overview of technology embodiments is provided below and then specific technology embodiments are described in further detail later. This initial summary is intended to aid readers in understanding the technology more quickly, but is not intended to identify key features or essential features of the technology nor is it intended to limit the scope of the claimed subject matter.

Electronic device packages typically include a substrate with one or more dies or components mounted thereon. For example, a System on a Chip (SoC) package typically includes a processor along with one or more advanced peripheral components, such as a graphics processing unit (GPU) or WiFi module on a substrate. The different materials in an electronic device package often have different coefficients of thermal expansion, and as a result, warping or other deformation can occur during operation.

A stiffener or stiffener layer may be added to the electronic device package to mitigate warpage or deformation. The stiffener may comprise a metallic material in order to provide strength or rigidity. Suitable metallic material can include steel (e.g., iron alloys such as stainless steel, carbon steel, etc.), aluminum (e.g., aluminum alloys), magnesium (e.g., magnesium alloys), copper (e.g., copper alloys), nickel (e.g., nickel alloys), etc. A stiffener can comprise a single structural material or multiple structural materials in any combination. However, a stiffener that comprises a metallic material can cause or contribute to, unintentional electromagnetic or radio frequency interference. For example, the stiffener can be a resonant structure that acts as an antenna that is electrically excited by electromagnetic or radio signals such as high speed interface signals. The electromagnetic or radio signals may be generated by an electric field that is created by electric current flowing through traces in or on the electronic device package during normal operations. The stiffener, acting as an antenna, may intercept these signals and amplify and radiate them. When this happens, the stiffener may be described as a "self-resonating" stiffener. The signals amplified and radiated by the stiffener may cause EMI/RFI in the electronic device package, or in other devices or components that are located in proximity to the stiffener. For example, EMI/RFI generated by the self-resonating stiffener may interfere with an antenna for WiFi, cellular signals, or other radio signals, employed in a system or device associated with the electronic device package. It should be appreciated that electromagnetic signals that may be radiated by the stiffener may originate within the electronic device package or may originate outside of the electronic device package.

The present technology attenuates or absorbs electromagnetic signals, such as EMI/RFI signals, before the electromagnetic signals are received by a stiffener. In some embodiments, the stiffener may be metallic and bonded to a substrate of the electronic device packaging using a bonding layer. The bonding may be a mechanical bond or other type of bond. In some embodiments, the bonding layer may comprise magnetic particles held in a bonding medium or material, such as an adhesive, a resin, an epoxy, or other bonding material to be combined with the magnetic particles and bond the stiffener to the substrate. The magnetic particles attenuate and absorb at least a portion of, or all of, the electromagnetic signals. The bonding layer with the magnetic particles may be described as a "magnetic lossy bonding layer," and when referred to with specific bonding materials may be referred to with such terms as "magnetic lossy resin," or "magnetic lossy epoxy" and the like. In one aspect, the magnetic particles comprise iron (Fe), ferrosilicon (FeSi), and/or iron oxides. The magnetic particles may exhibit high frequency loss properties in radio bands. The magnetic properties of a bonding layer with magnetic particles at least partially shield the stiffener from receiving the electromagnetic signals. Adjusting the percentage or ratio of the magnetic particles and bonding material (e.g. resin) in the bonding layer may control frequency-dependent loss properties of the electromagnetic signals, and thus prevent, minimize, or reduce amplification and/or radiation of at least a portion of the electromagnetic signals and maintain a low EMI/RFI risk.

The bonding layer with the magnetic particles may operate to absorb the electromagnetic signals without requiring the bonding layer to be grounded. For example, a bonding layer with silver particles, as opposed to the magnetic particles, may require the bonding layer to be grounded to a ground layer of the electronic device packaging. The grounding may require openings, such as solder resist openings (SROs) to be formed in any layers in the electronic device package that are between the stiffener and the ground layer. The SROs may be costly to create during the manufacturing process, complicate the design of the electronic device package, and limit trace routing flexibility. The present technology that employees a bonding layer with magnetic particles may not require the stiffener layer or the bonding layer to be electrically grounded and therefore may not require SROs in any layer of the electronic device packaging. The stiffener that is mechanically bonded to the electronic device package using a bonding layer with magnetic particles may be described as "electrically floating" with respect to the electronic device package. Introducing magnetic particles into the bonding layer is also significantly less costly than silver particles.

FIG. 1A is a diagram illustrating a cross section view of an electronic device package 100 with a bonding layer 108 for absorbing and attenuating electromagnetic signals. The electronic device package 100 comprises an active layer 102, a substrate 104, a stiffener layer 106, and a bonding layer 108. It should be appreciated that the electronic device package 100 may comprise other layers or components not depicted in FIG. 1A. The active layer 102 may be any layer or combination of layers or components that produce electromagnetic signals during operation. In one embodiment, the active layer 102 may comprise one or more silicon dies, components, or modules. The active layer 102 may include electronic features such as traces and integrated circuits. The generation of electromagnetic signals by the active layer 102 may be an unintentional byproduct of current running through traces or circuits, or operation of dies, components, or modules. This may be described as electromagnetic noise. The active layer 102 may be attached or coupled to substrate 104. The substrate 104 may define a plane and have a surface. The substrate 104 may include a signal layer or other layers or electronic components that generate electromagnetic signals. The active layer 102 may cover only a portion of one surface of the substrate 104. In some embodiments, the substrate 104 may comprise multiple layers, serving various purposes.

The substrate 104 may be flexible or susceptible to warping. A warped substrate may cause errors or defects in the electronic device package 100, for example by creating contact opens. The stiffener layer 106 may be mechanically coupled or otherwise attached to the substrate 104 to provide stiffness to the electronic device package 100 to minimize, reduce, or prevent warping. In some embodiments, the stiffener layer 106 may comprise a metallic material. For example, the stiffener may be a metal component, a metal alloy, or may be completely metal. The metallic material may allow the stiffener layer 106 to be lightweight, thin, and strong. However, a metal stiffener layer 106 may act as an antenna that receives electromagnetic signals from the active layer 102 and then amplifies and radiates the electromagnetic signals. This may cause EMI/RFI in the electronic device package 100 or other devices and components that are proximately close to the stiffener layer 106. In one aspect, the stiffener layer 106 is bonded to the substrate 104 via the bonding layer 108. In some embodiments, the stiffener layer 106 may be in the same plane as the active layer 102 and may effectively surround the active layer 102.

The bonding layer 108 may be any suitable adhesive and may comprise a resin such as an epoxy that has magnetic particles combined with the resin. In one embodiment, the bonding layer 108 may be formed using thermal compression bonding. The bonding layer 108 may be described as a "magnetic lossy bonding layer" or a "signal attenuating layer". The magnetic particles may range in size from a tenth of a nanometer to hundreds of micrometers (e.g. 0.1 nm to 900 um). The magnetic particles may include any type of material that has magnetic properties. For example, the magnetic particles can include iron (Fe), ferrosilicon (FeSi), iron oxides, or a combination thereof. Additionally, the magnetic particles can include nickel (Ni), cobalt (Co), zinc (Zn), copper (Cu), zirconium (Zr), barium (Ba), strontium (Sr), neodymium (Nd), tantalum (Ta), ferrites, iron, ferrosilicon, iron oxides, or a combination thereof. The magnetic particles are not limited to these specific examples. The magnetic particles in the bonding layer 108 may cause high frequency loss properties in radio bands. The ratio of the magnetic particles compared to the resin in the bonding layer 108 may be any desired or suitable amount or ratio that provides desired signal attenuation, while maintaining sufficient bonding strength. In one example, the particles may be present in an amount of up to 80% by volume of the bonding layer. In another example, the particles may be present in an amount of from about 15% to about 70% by volume. In yet another example, the ratio may be 50-60% by volume. In yet another aspect, the particles may present in an amount of less than 30% by volume. In yet a further aspect, the particles may be present an amount of less than 15% by volume. In one aspect, the lossy magnetic epoxy property of the bonding layer 108 may have a minimum magnetic loss greater than and equal to approximately 0.5. In some embodiments, magnetic loss may range from 0.1 to 5. The bonding layer 108 with the magnetic particles may operate to attenuate and absorb at least a portion of the electromagnetic signals.

The bonding layer 108 with the magnetic particles allows the bonding layer 108 to absorb and attenuate electromagnetic signals without requiring the stiffener layer 106 or the bonding layer 108 to be grounded. For example, a bonding layer that is combined with silver particles may require the stiffener layer 106 and/or the bonding layer 108 to be grounded to a ground layer associated with the electronic device package 100. The grounding may require SROs to be formed through the substrate 104 or any other layer between the stiffener layer 106 and the ground layer of the electronic device package 100. The SROs may be costly and limit the design possibilities of the electronic device package 100. The bonding layer 108 with the magnetic particles may be formed without silver particles and may not be electrically grounded. In one aspect, where the stiffener layer 106 is not grounded, the stiffener layer 106 may be described as electrically floating.

Figure 1B:
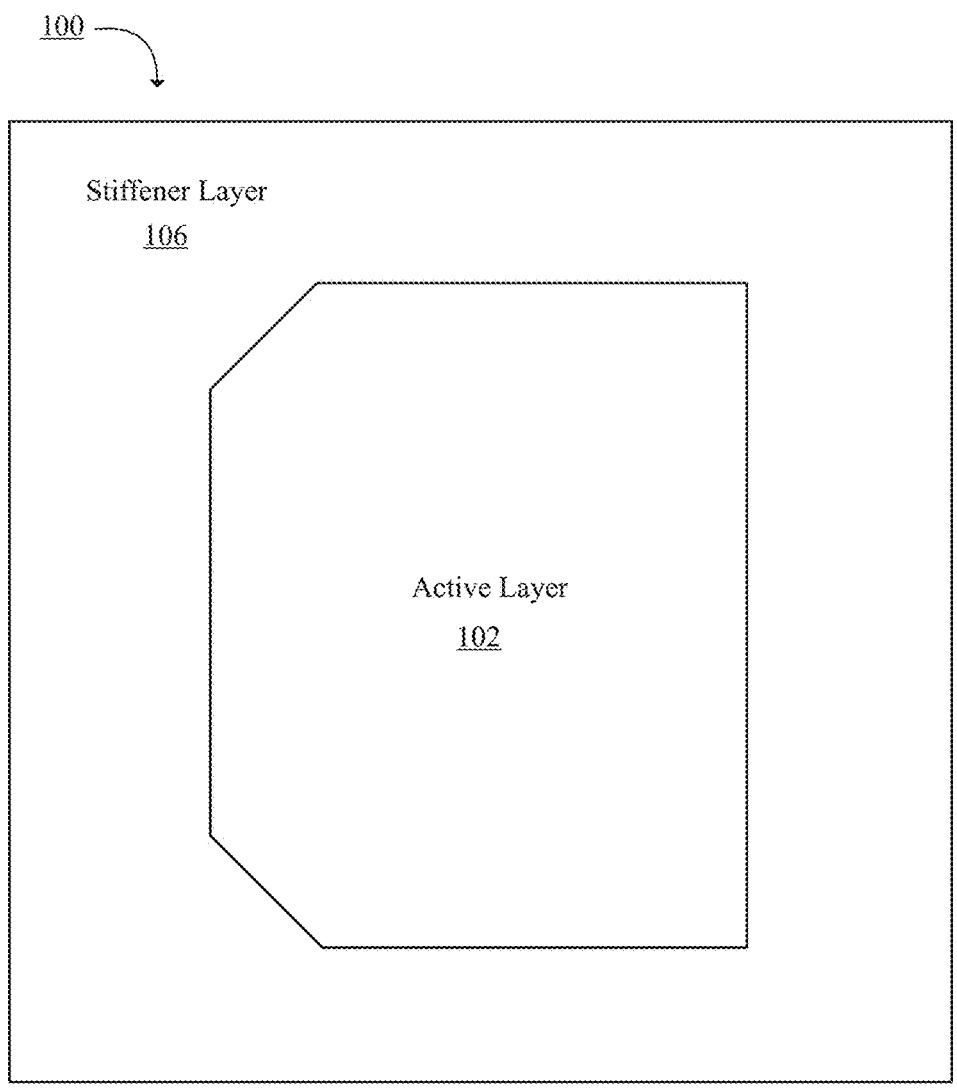
FIG. 1B is a block diagram of a top view of an electronic device package in accordance with an example embodiment.

FIG. 1B is a diagram illustrating a top view of an exemplary electronic device package 100 with the active layer 102. The electronic device package 100 of FIG. 1B may comprise all the features, capabilities, and components of the electronic device package 100 of FIG. 1A. The top view depicted in FIG. 1B shows the active layer 102 surrounded by the stiffener layer 106. The substrate may be under both the stiffener layer 106 and the active layer 102.

In some embodiments, the bonding layer may be under the stiffener layer 106 and may not be under the active layer 102.

Figure 1C:
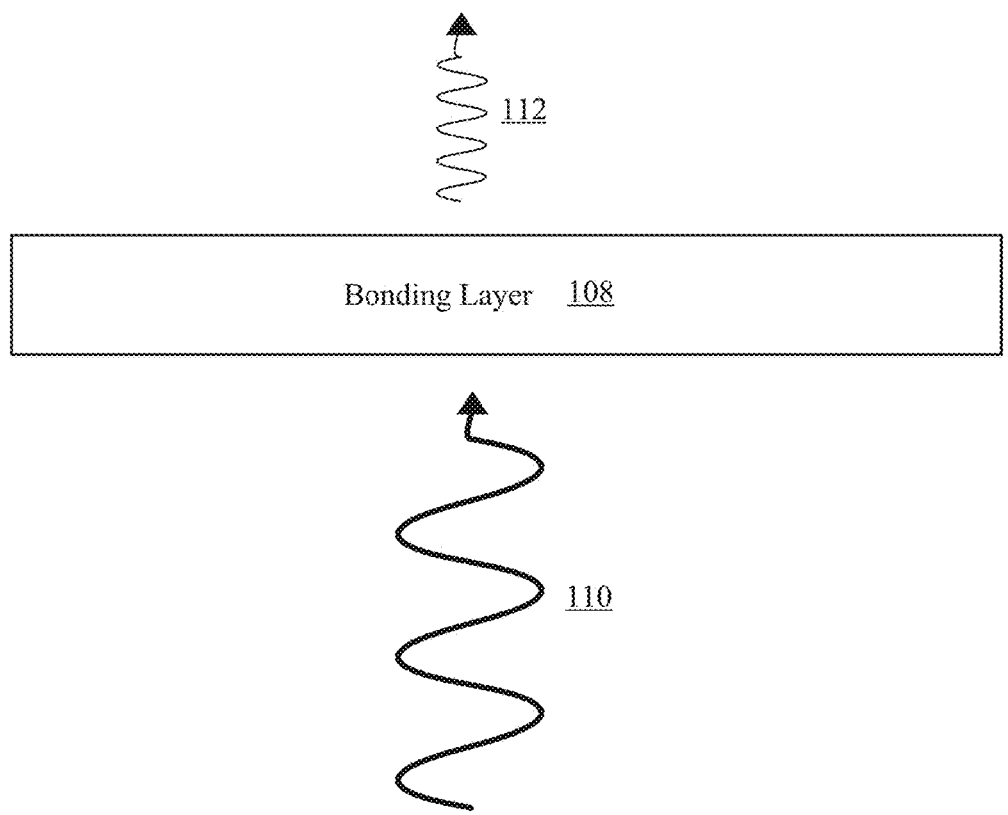
FIG. 1C is a block diagram the bonding layer of the electronic device package in accordance with an example embodiment.

FIG. 1C is a diagram illustrating the bonding layer 108 attenuating and absorbing electromagnetic signals. The bonding layer 108 may be a layer of an electronic device package and may have all the features, capabilities, and components of the bonding layer 108 of FIG. 1A. In one aspect, the bonding layer 108 comprises an adhesive combined with magnetic particles. Any suitable non-conductive adhesive (e.g., resin, polymer, epoxy cement, alumina or silicate-based ceramic adhesive, urethane adhesive, polyimide adhesive, etc.) can be used. The bonding layer 108 is depicted as receiving or absorbing electromagnetic noise (e.g. an EMI signal) 110. The electromagnetic noise 110 may be generated by the active layer or other components of the electronic device package. The electromagnetic noise 110 may be generated intentionally or unintentionally. The bonding layer 108 may absorb all of the electromagnetic noise 110 or may absorb a portion of the electromagnetic noise 110. The electromagnetic noise 112 depicts a portion of the electromagnetic noise 110 that has been attenuated after having passed through the bonding layer 108 with the magnetic particles. The electromagnetic noise 112 represents a reduction of electromagnetic noise compared to the electromagnetic noise 110. The electromagnetic attenuation of the bonding layer 108 with the magnetic particles may be expressed by Equations 1 and 2:

$$\text{Attenuation} = Ct\sqrt{f\mu\sigma} \qquad \text{Equation 1}$$

In Equation 1, attenuation is calculated where C is the constant, f is the frequency, t is the thickness, $\mu$ is the complex permeability, and $\sigma$ is the conductivity. In one aspect, due to high frequency loss properties ($\mu r>1$, tan $\delta\mu>>0$), the bonding layer 108 increases electromagnetic noise attenuation and make the stiffener an inefficient resonating structure.

$$Q(f) = 2\pi f \times \frac{\text{Energy stored}}{\text{Energy dissipated}} \qquad \text{Equation 2}$$

In Equation 2, Q is the lower quality factor of the stiffener layer which is a function off the frequency. In one aspect, the attenuation or noise reduction of the bonding layer 108 is greater than 20 dB which may be greater than a 99% noise reduction. In one example, the electromagnetic signal may be attenuated (e.g. signal interference reduced) by at least about 75%. In another aspect, the electromagnetic signal may be attenuated by at least about 90%. In another aspect, the electromagnetic signal may be attenuated by from about 70% to about 99.9%.

Figure 2:
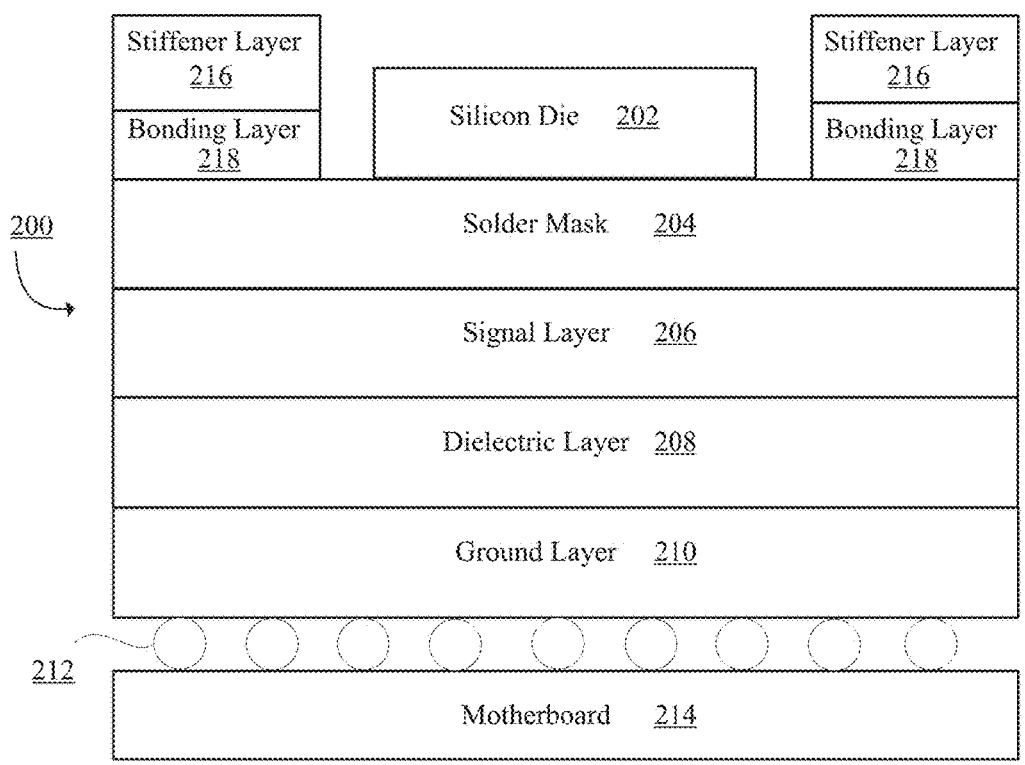
FIG. 2 is a block diagram of an electronic device package in accordance with an example embodiment.

FIG. 2 is a block diagram illustrating an electronic device package 200 attached to a motherboard 214. The electronic device package 200 may have all the same capabilities and features of the electronic device package 100 of FIGS. 1A and 1B. The electronic device package 200 may comprise a silicon die 202, a solder mask 204, a signal layer 206, a dielectric layer 208, a ground layer 210, a stiffener layer 216, and a bonding layer 218. In one aspect, the silicon die 202 has the same features and capabilities of the active layer 102 of FIGS. 1A and 1B. In one aspect, a combination of the solder mask 204, the signal layer 206, the dielectric layer 208, and/or the ground layer 210 comprise the substrate 104 of FIGS. 1A and 1B.

The ground layer 210 is a layer of the electronic device package 200 designed to electrically ground the electronic device package 200 and/or the components or layers of the electronic device package 200. The stiffener layer 216 of the present technology may not be electrically connected to (e.g. electrically uncoupled from) the ground layer 210. The dielectric layer 208 may be attached to the ground layer 210. The dielectric layer 208 may be an electrical insulator that can be polarized by an applied electric field. The signal layer 206 may be attached to the dielectric layer 208. The stiffener layer 216 may generate or amplify electromagnetic signals intentionally or unintentionally. The solder mask 204 may be attached to the signal layer 206. The solder mask 204 in some embodiments can be a solder resist material and may be protection against oxidation and to prevent electrical connections (e.g. unintentional electrical connections) from forming between the silicon die 202 and the signal layer 206. The silicon die 202 may be any die or component known in the art, such as a device that has circuitry such as an integrated circuit. The silicon die 202 may only cover a portion of one surface of the solder mask 204. The bonding layer 218 may mechanically bond or adhere the stiffener layer 216 to the solder mask 204. The bonding layer 218 may be attached to a portion of one surface of the solder mask 204. The bonding layer 218 may attach to the same surface of the solder mask 204 as the silicon die 202.

In one aspect, the bonding layer 218 with magnetic particles shields the stiffener layer 216 from electromagnetic signals or noise by absorbing or attenuating the electromagnetic signals. The bonding layer 218 with the magnetic particles may allow the stiffener layer 216 to remain ungrounded to the ground layer 210. The solder mask 204, the stiffener layer 216, the dielectric layer 208 may be formed or designed with no solder resist openings to ground the stiffener layer 216. The stiffener layer 216 may be described as electrically floating.

In one aspect, the electronic device package 200 may be coupled, to the motherboard 214. The motherboard 214 may be a motherboard of an electronic device such as a computing system of which the electronic device package 200 is a component part. In one embodiment, the electronic device package 200 may be coupled to the motherboard 214 using solder balls or other connections 212.

Figure 3:
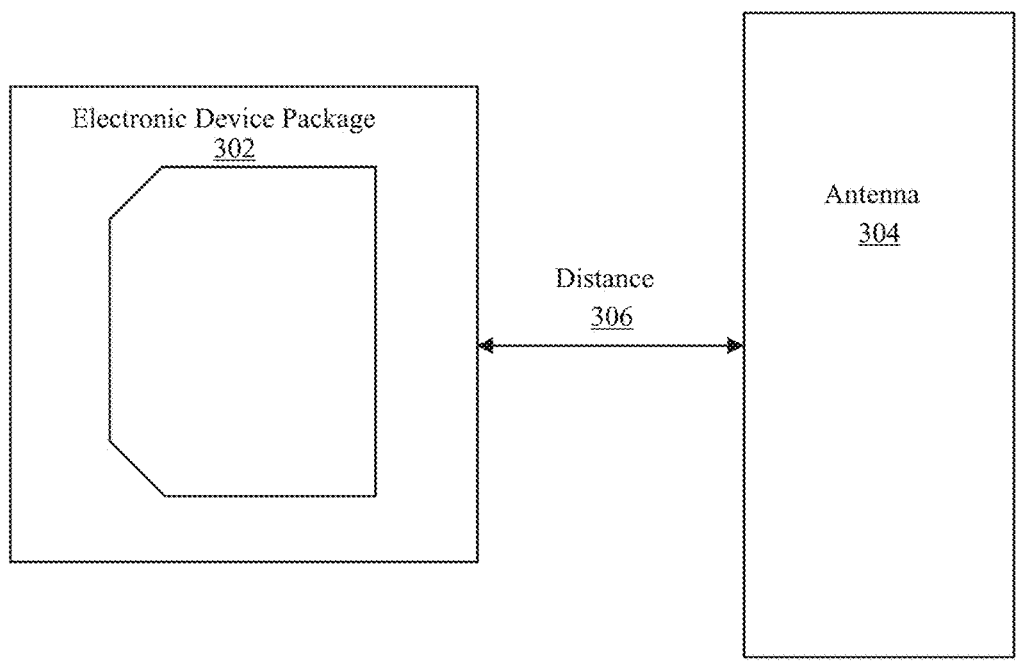
FIG. 3 is a block diagram of an electronic device package and an antenna in accordance with an example embodiment.

FIG. 3 is a block diagram illustrating an environment 300 depicting an electronic device package 302 and an antenna 304. The electronic device package 302 may have all the same capabilities and features of the electronic device package 100 of FIGS. 1A and 1B and electronic device package 200 of FIG. 2, as well as other capabilities, elements, or features. The electronic device package 302 may be in close proximity to the antenna 304 as depicted by the distance 306. For example, the distance 306 may be 50 millimeters. In some embodiments, the antenna 304 may be an antenna associated with a device to which the electronic device package 302 is coupled. The antenna 304 may be any type of antenna 304 that can send or receive electromagnetic signals. For example, the antenna 304 may be for radio bands related to WiFi, cellular radios, global positioning satellite (GPS) technology, Bluetooth, etc. Unintentional noise generated by the components of the electronic device package 302 may cause RFI for the antenna 304. The bonding layer with magnetic particles of the present technology serves to absorb or attenuate intentional or unintentional noise from the electronic device package such that all or a portion of the unintentional noise may not interfere with the antenna 304.

Figure 4:
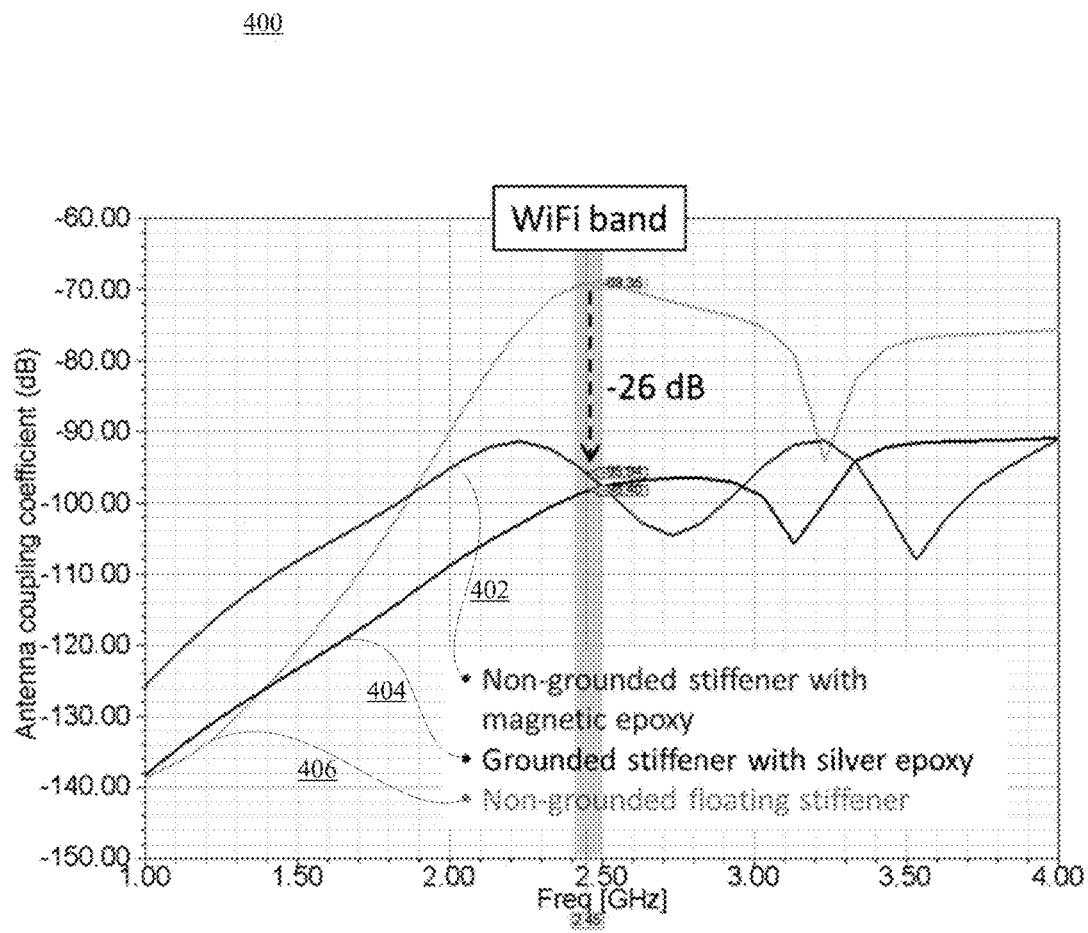
FIG. 4 is a graph of an RFI noise coupling coefficient for various electronic device packages in accordance with an example embodiment.

FIG. 4 is a graph 400 of an RFI noise coupling coefficient for various electronic device packages. The graph 400 depicts frequency measured in gigahertz (GHz) along the horizontal access and antenna coupling coefficient measured in decibels (dBs). Line 402 of graph 400 depicts measurements for an ungrounded stiffener with a bonding layer combined with magnetic particles which is an embodiment of the present technology. Line 404 depicts a stiffener with a bonding layer that is combined with silver particles that is grounded. Line 406 depicts a stiffener that is not grounded and is floating. The stiffener associated with line 406 does not have an epoxy with either magnetic particles or silver particles. The graph 400 depicts available lossy magnetic properties in 2-3 GHz. At approximately 2.4 GHz, centered around the WiFi band, the line 406 compared to the line 40 shows a loss of −26 dB. This demonstrates the attenuation of electromagnetic signals by the stiffener with the epoxy combined with magnetic particles.

Figure 5:
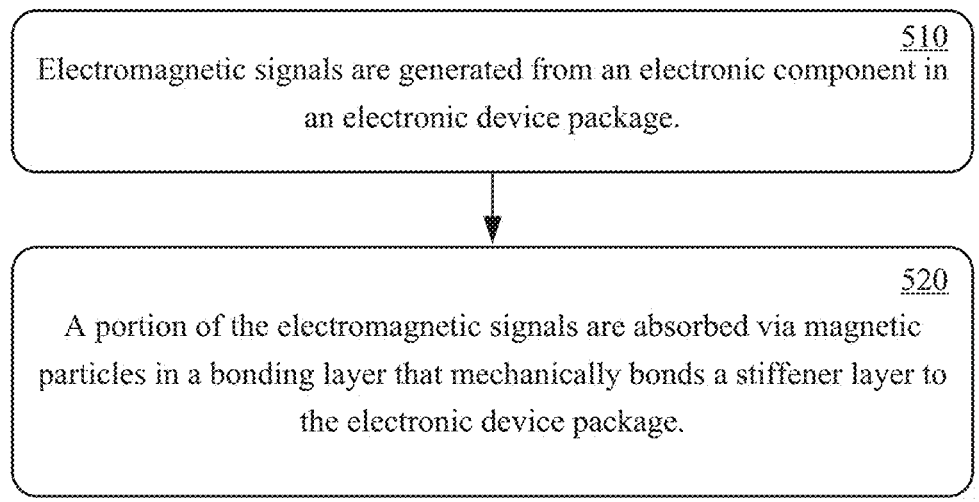
FIG. 5 is a flow diagram of a method for absorbing electromagnetic signals in an electronic device package in accordance with an example embodiment.

FIG. 5 illustrates a flow diagram of methods or operations for absorbing electromagnetic signals in an electronic device package in accordance with embodiments of the present technology. The electronic device package may be the electronic device package 100, 200, or 302 of FIGS. 1A, 1B, 2, and 3 respectively, or any other electronic device package that would potentially benefit from the inclusion of a bonding layer and stiffener as described herein. For example, starting in block 510, electromagnetic signals are generated from an electronic component in an electronic device package. A portion of the electromagnetic signals are absorbed via magnetic particles in a bonding layer that bonds a stiffener layer to the electronic device package, as in block 520.

FIG. 6 illustrates a flow diagram of methods or operations for manufacturing an electronic device package in accordance with embodiments of the present technology. The electronic device package may be the electronic device package 100, 200, or 302 of FIGS. 1A, 1B, 2, and 3 respectively. For example, starting in block 610 a substrate defining a plane is provided. An active layer is attached to the substrate comprising an electronic component that generates electromagnetic signals, as in block 620. A stiffener layer is bonded to the substrate using a bonding layer to provide strength to the electronic device package, the bonding layer comprising a bonding material, such as a resin or adhesive combined with magnetic particles, wherein the magnetic particles are configured to attenuate and absorb a portion of the electromagnetic signals, as in block 630.

Figure 7:
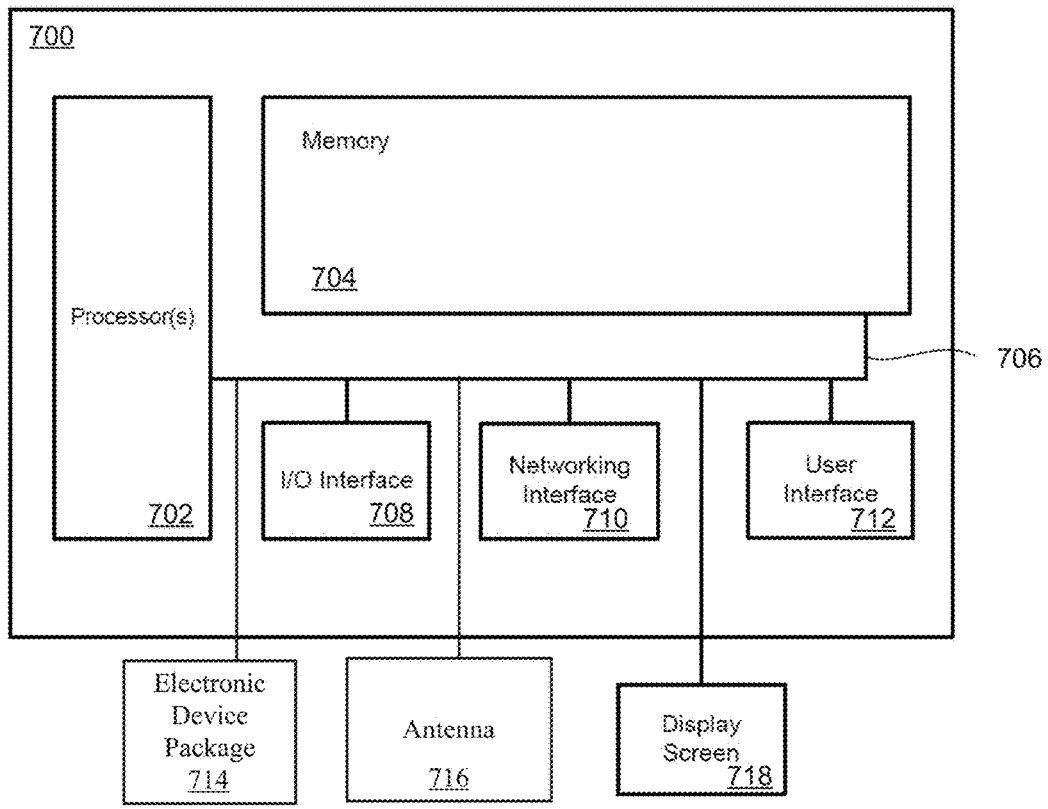
FIG. 7 is a block diagram of an example computer system with an electronic device package in accordance with another example embodiment.

FIG. 7 depicts an exemplary system upon which embodiments of the present disclosure may be implemented. For example, the system of FIG. 7 may be a computer system. The system can include a processor 702, a memory 704, and circuitry 706. The circuitry can be configured to implement operation of the hardware described herein. Various embodiments of such systems for FIG. 7 can include smart phones, laptop computers, handheld and tablet devices, CPU systems, SoC systems, server systems, networking systems, storage systems, high capacity memory systems, or any other computational system.

The system can also include an I/O (input/output) interface 708 for controlling the I/O functions of the system, as well as for I/O connectivity to devices outside of the system. A network interface 710 can also optionally be included for network connectivity. The network interface can control network communications both within the system and outside of the system. The network interface can include a wired interface, a wireless interface, a Bluetooth interface, optical interface, and the like, including appropriate combinations thereof. Furthermore, the system can additionally include various user interfaces, display devices, as well as various other components that would be beneficial for such a system.

The system can also include memory (not shown) in addition to memory 704 that can include any device, combination of devices, circuitry, and the like that is capable of storing, accessing, organizing and/or retrieving data. Non-limiting examples include SANs (Storage Area Network), cloud storage networks, volatile or non-volatile RAM, phase change memory, optical media, hard-drive type media, and the like, including combinations thereof.

The processor 702 can be a single or multiple processors, and the memory 704 can be a single or multiple memories. The local communication interface can be used as a pathway to facilitate communication between any of a single processor, multiple processors, a single memory, multiple memories, the various interfaces, and the like, in any useful combination.

The system can also include a user interface 712 such as a graphical user interface for interacting with the user. The system can also include a display screen 718 for displaying images and the user interface 712. The system can also include an electronic device package 714 taking any suitable or specific form and an antenna 716.

The disclosed embodiments may be implemented, in some cases, in hardware, firmware, software, or any combination thereof. Portions of the disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

EXAMPLES

The following examples pertain to specific technology embodiments and point out specific features, elements, or steps that may be used or otherwise combined in achieving such embodiments.

In one example there is provided an electronic device package, comprising a package substrate, an active layer operably coupled to the package substrate, a metallic stiffener, and a magnetic lossy bonding layer that bonds the stiffener to the package substrate.

In one example of an electronic device package, the magnetic lossy bonding layer comprises a bonding material including an adhesive and a plurality of magnetic particles.

In one example of an electronic device package, the adhesive is a resin.

In one example of an electronic device package, the adhesive is an epoxy.

In one example of an electronic device package, the magnetic particles attenuate an electromagnetic signal.

In one example of an electronic device package, the magnetic particles include a member of the group consisting of: nickel (Ni), cobalt (Co), zinc (Zn), copper (Cu), zirconium (Zr), barium (Ba), strontium (Sr), neodymium (Nd), tantalum (Ta), ferrites, iron (Fe), ferrosilicon (FeSi), iron oxides, and mixtures thereof.

In one example of an electronic device package, the magnetic particles comprise iron (Fe).

In one example of an electronic device package, the magnetic particles are present in the bonding material in an amount of up to 70 percent by volume.

In one example of an electronic device package, the magnetic particles are present in the bonding material in an amount of from 50 to 60 percent by volume.

In one example of an electronic device package, the magnetic lossy bonding layer is substantially free of non-magnetic particles.

In one example of an electronic device package, the magnetic lossy bonding layer is substantially free of silver particles.

In one example of an electronic device package, the magnetic particles control frequency-dependent loss properties of the electromagnetic signal.

In one example of an electronic device package, the metallic stiffener is electrically floating.

In one example of an electronic device package, the metallic stiffener includes a material selected from the group consisting of: iron, iron alloys, steel, aluminum, aluminum alloys, magnesium, magnesium alloys, copper, copper alloys, nickel, nickel alloys, and combinations thereof.

In one example of an electronic device package, the active layer comprises at least one electromagnetic signal-generating component.

In one example of an electronic device package, the electromagnetic signal-generating component is a die.

In one example of an electronic device package, the die includes an integrated circuit.

In one example of an electronic device package, the package substrate comprises, a ground layer defining a plane configured to ground the electronic device package, a dielectric layer coupled to the ground layer, a signal layer coupled to the dielectric layer; and a solder mask coupled to the signal layer.

In one example of an electronic device package, the solder mask has no solder resist openings.

In one example of an electronic device package, the signal layer generates an electromagnetic signal.

In one example there is provide a computing system comprising a motherboard, and an electronic device package as recited herein operably coupled to the motherboard.

In one example of a computing system, the computing system comprises a desktop computer, a laptop, a tablet, a smartphone, a wearable device, a server, or a combination thereof.

In one example of a computing system, the computing system further comprises a processor, a memory device, a heat sink, a radio, a slot, a port, or a combination thereof operably coupled to the motherboard.

In one example there is provided, a stiffener assembly, comprising a metallic stiffener, and a magnetic lossy bonding layer configured to bond the stiffener to the an electronic device package substrate.

In one example of a stiffener assembly, the magnetic lossy bonding layer comprises a bonding material including an adhesive and a plurality of magnetic particles.

In one example of a stiffener assembly, the adhesive is a resin.

In one example of a stiffener assembly, the adhesive is an epoxy.

In one example of a stiffener assembly, the magnetic particles attenuate an electromagnetic signal.

In one example of a stiffener assembly, the magnetic particles include a member of the group consisting of: nickel (Ni), cobalt (Co), zinc (Zn), copper (Cu), zirconium (Zr), barium (Ba), strontium (Sr), neodymium (Nd), tantalum (Ta), ferrites, iron (Fe), ferrosilicon (FeSi), iron oxides, and mixtures thereof.

In one example of a stiffener assembly, the magnetic particles comprise iron (Fe).

In one example of a stiffener assembly, the magnetic particles are present in the bonding material in an amount of up to 70 percent by volume.

In one example of a stiffener assembly, the magnetic particles are present in the bonding material in an amount of from 50 to 60 percent by volume.

In one example of a stiffener assembly, the magnetic lossy bonding layer is substantially free of non-magnetic particles.

In one example of a stiffener assembly, the magnetic lossy bonding layer is substantially free of silver particles.

In one example of a stiffener assembly, the magnetic particles control frequency-dependent loss properties of the electromagnetic signal.

In one example of a stiffener assembly, the metallic stiffener is electrically floating.

In one example of a stiffener assembly, the metallic stiffener includes a material selected from the group consisting of: iron, iron alloys, steel, aluminum, aluminum alloys, magnesium, magnesium alloys, copper, copper alloys, nickel, nickel alloys, and combinations thereof.

In one example of a stiffener assembly, the assembly further comprises a peelable release liner coupled to the magnetic lossy bonding layer.

In one example of a stiffener assembly, the release liner comprises a polymeric material.

In one example of a stiffener assembly, the polymeric material comprise polytetrafluorethylene (PTFE)

In one example there is provided, a method for manufacturing an electronic device package, comprising providing a substrate defining a plane, coupling an active layer to the substrate, and coupling a stiffener layer to the substrate with a magnetic lossy bonding layer.

In one example of a method for manufacturing an electronic device package, the magnetic lossy bonding layer comprises a bonding material including an adhesive and a plurality of magnetic particles.

In one example of a method for manufacturing an electronic device package, the adhesive is a resin.

In one example of a method for manufacturing an electronic device package, the adhesive is an epoxy.

In one example of a method for manufacturing an electronic device package, the magnetic particles attenuate an electromagnetic signal.

In one example of a method for manufacturing an electronic device package, the magnetic particles include a member of the group consisting of: nickel (Ni), cobalt (Co), zinc (Zn), copper (Cu), zirconium (Zr), barium (Ba), strontium (Sr), neodymium (Nd), tantalum (Ta), ferrites, iron (Fe), ferrosilicon (FeSi), iron oxides, and mixtures thereof.

In one example of a method for manufacturing an electronic device package, the magnetic particles comprise iron (Fe).

In one example of a method for manufacturing an electronic device package, the magnetic particles are present in the bonding material in an amount of up to 70 percent by volume.

In one example of a method for manufacturing an electronic device package, the magnetic particles are present in the bonding material in an amount of from 50 to 60 percent by volume.

In one example of a method for manufacturing an electronic device package, the magnetic lossy bonding layer is substantially free of non-magnetic particles.

In one example of a method for manufacturing an electronic device package, the magnetic lossy bonding layer is substantially free of silver particles.

In one example of a method for manufacturing an electronic device package, the magnetic particles control frequency-dependent loss properties of the electromagnetic signal.

In one example of a method for manufacturing an electronic device package, the metallic stiffener is electrically floating.

In one example of a method for manufacturing an electronic device package, the metallic stiffener includes a material selected from the group consisting of: iron, iron alloys, steel, aluminum, aluminum alloys, magnesium, magnesium alloys, copper, copper alloys, nickel, nickel alloys, and combinations thereof.

In one example there is provided a method for attenuating electromagnetic signals in an electronic device package, comprising coupling a stiffener to a substrate of the electronics device package with a magnetic lossy bonding layer, such that the stiffener is shielded from at least a portion of any electromagnetic signals generated during operation of the electronic device package.

In one example of a method for attenuating electromagnetic signals in an electronic device package, the electromagnetic signals are generated by an active layer in the electronic device package.

In one example of a method for attenuating electromagnetic signals in an electronic device package, the electromagnetic signals are generated by at least one layer in the substrate.

Circuitry used in electronic components or devices (e.g. a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. An electronic device package, comprising:
a package substrate;
an active layer operably coupled to the package substrate;
a metallic stiffener; and
a magnetic lossy bonding layer coupling the stiffener to the package substrate;
wherein either:
the metallic stiffener is electrically floating: or
the package substrate comprises:
a ground layer defining a plane configured to ground the electronic device package;
a dielectric layer coupled to the ground layer;
a signal layer coupled to the dielectric layer; and
a solder mask coupled to the signal layer.

2. The electronic device package of claim 1, wherein the magnetic lossy bonding layer comprises a bonding material including an adhesive and a plurality of magnetic particles.

3. The electronic device package of claim 2, wherein the adhesive is a resin.

4. The electronic device package of claim 2, wherein the adhesive is an epoxy.

5. The electronic device package of claim 2, wherein the magnetic particles attenuate an electromagnetic signal.

6. The electronic device package of claim 2, wherein the magnetic particles include a member of the group consisting of: nickel (Ni), cobalt (Co), zinc (Zn), copper (Cu), zirconium (Zr), barium (Ba), strontium (Sr), neodymium (Nd), tantalum (Ta), ferrites, iron (Fe), ferrosilicon (FeSi), iron oxides, and mixtures thereof.

7. The electronic device package of claim 2, wherein the magnetic particles are present in the bonding material in an amount of up to 70 percent by volume.

8. The electronic device package of claim 2, wherein the magnetic particles are present in the bonding material in an amount of from 50 to 60 percent by volume.

9. The electronic device package of claim 1, wherein the magnetic lossy bonding layer is substantially free of non-magnetic particles.

10. The electronic device package of claim 1, wherein the magnetic lossy bonding layer is substantially free of silver particles.

11. The electronic device package of claim 1, wherein the active layer comprises at least one electromagnetic signal-generating component.

12. A method for manufacturing an electronic device package, comprising:
providing a substrate defining a plane;
coupling an active layer to the substrate; and
coupling a stiffener layer to the substrate with a magnetic lossy bonding layer;
wherein the metallic stiffener is electrically floating.

13. The method of claim 12, wherein the magnetic lossy bonding layer comprises a bonding material including an adhesive and a plurality of magnetic particles.

14. The method of claim 13, wherein the adhesive is a resin.

15. The method of claim 13, wherein the adhesive is an epoxy.

16. The method of claim 13, wherein the magnetic particles attenuate an electromagnetic signal.

17. The method claim 13, wherein the magnetic particles include a member of the group consisting of: nickel (Ni), cobalt (Co), zinc (Zn), copper (Cu), zirconium (Zr), barium (Ba), strontium (Sr), neodymium (Nd), tantalum (Ta), ferrites, iron (Fe), ferrosilicon (FeSi), iron oxides, and mixtures thereof.

18. The method of claim 13, wherein the magnetic particles are present in the bonding material in an amount of up to 70 percent by volume.

19. The method of claim 13, wherein the magnetic particles are present in the bonding material in an amount of from 50 to 60 percent by volume.

20. The method of claim 12, wherein the magnetic lossy bonding layer is substantially free of non-magnetic particles.

21. The method of claim 12, wherein the magnetic lossy bonding layer is substantially free of silver particles.

22. A method for attenuating electromagnetic signals in an electronic device package, comprising:
coupling a stiffener to a substrate of the electronics device package with a magnetic lossy bonding layer, such that the stiffener is shielded from at least a portion of any electromagnetic signals generated during operation of the electronic device package;
wherein the electromagnetic signals are generated by at least one layer in the substrate.

23. The method of claim 22, wherein the electromagnetic signals are generated by an active layer in the electronic device package.

24. The method of claim 22, wherein the electromagnetic signals are reduced in an amount greater than 20 db.

* * * * *